United States Patent [19]

Miyata et al.

[11] Patent Number: 4,670,766

[45] Date of Patent: Jun. 2, 1987

[54] ANTI-BLOOMING IMAGE SENSOR

[75] Inventors: Yutaka Miyata, Hirakata; Takao Chikamura, Kyoto; Shinji Fujiwara, Minoo, all of Japan

[73] Assignee: Matsushita Electric Industrial Co. Ltd., Osaka, Japan

[21] Appl. No.: 816,980

[22] Filed: Jan. 7, 1986

Related U.S. Application Data

[63] Continuation of Ser. No. 407,904, Aug. 13, 1982.

[30] Foreign Application Priority Data

Aug. 20, 1981 [JP] Japan .................. 56-129374

[51] Int. Cl.⁴ .......................................... H01L 27/14
[52] U.S. Cl. ...................................... 357/30; 357/31; 357/32; 357/24
[58] Field of Search ............... 357/30, 31, 24, 24 LR, 357/24 M, 24 R, 32; 307/311

[56] References Cited

U.S. PATENT DOCUMENTS

| | | | |
|---|---|---|---|
| 3,866,067 | 2/1975 | Amelio | 357/24 X |
| 3,996,600 | 12/1976 | Patrin | 307/311 X |
| 4,236,829 | 12/1980 | Chikamura et al. | 357/30 X |
| 4,242,599 | 12/1980 | Suzuki | 307/311 |
| 4,271,420 | 6/1981 | Chikamura | 357/30 |
| 4,328,432 | 5/1982 | Yamazaki | 307/311 X |
| 4,354,104 | 10/1982 | Chikamura et al. | 357/30 X |
| 4,500,924 | 2/1985 | Ohta | 357/30 X |
| 4,504,848 | 3/1985 | Matsumoto et al. | 357/24 LR |

Primary Examiner—Andrew J. James
Assistant Examiner—William A. Mintel
Attorney, Agent, or Firm—Stevens, Davis, Miller & Mosher

[57] ABSTRACT

A solid-state image sensor is formed of the combination of a semiconductor substrate having a charge transfer function and a photoconductive film. In this solid-state image sensor, blooming suppressing capability is greatly increased by controlling the following potentials to fixed potentials, that is, (1) the potential of a transparent electrode formed on the photoconductive film, (2) the channel potential of a MOS field-effect transistor formed of a charge transfer stage and a gate electrode which are formed together with a Si diode in the semiconductor substrate in which the diode is electrically connected to the photoconductive film, and (3) the barrier potential of the charge transfer stage.

5 Claims, 6 Drawing Figures

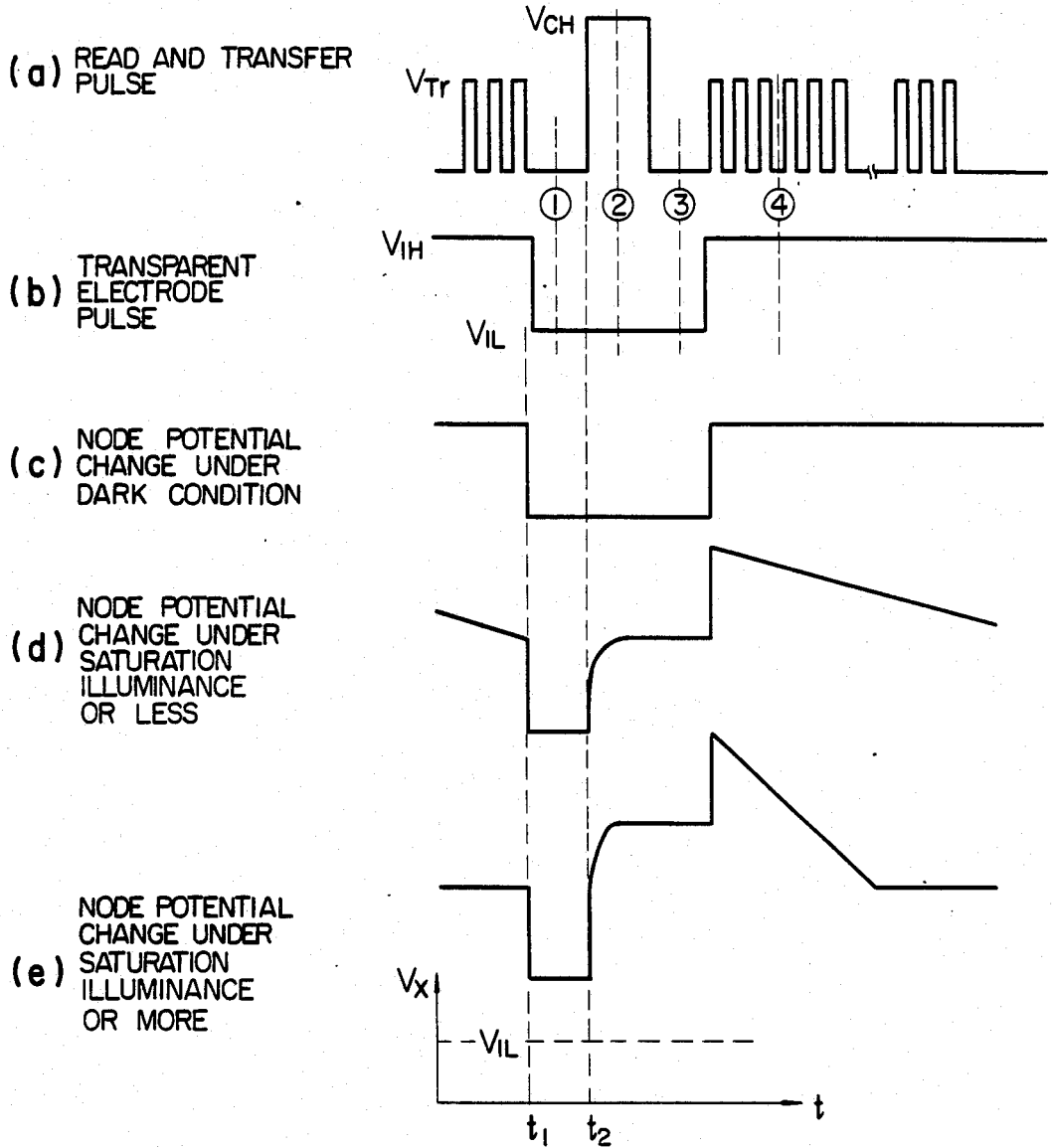

FIG. 4
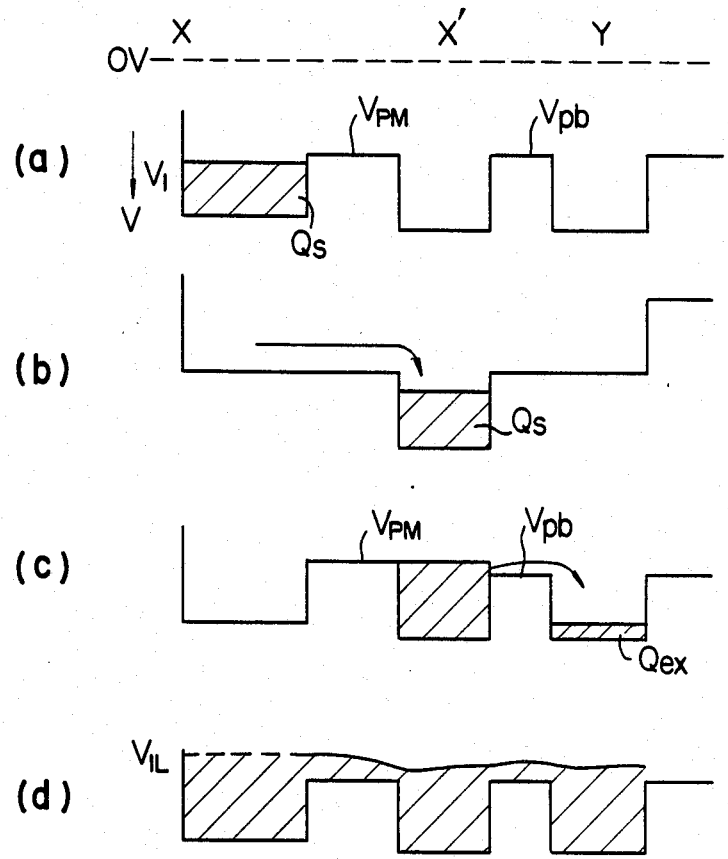
FIG. 6 AMOUNT OF BLOOMING
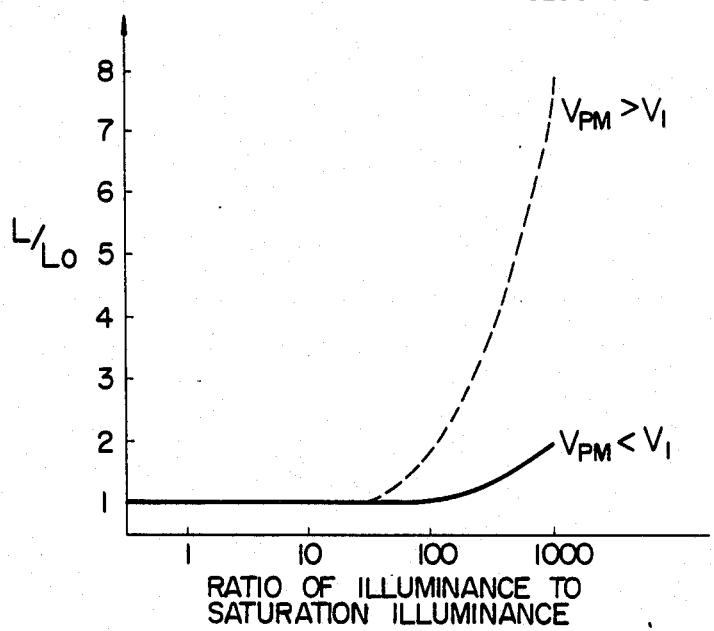

ANTI-BLOOMING IMAGE SENSOR

This application is a continuation of application Ser. No. 407,904, filed 8/13/82.

BACKGROUND OF THE INVENTION

This invention relates to an improvement of solid-state image sensors, and particularly to a solid-state image sensor in which the blooming phenomenon is suppressed.

Attention has been paid to the solid-state image sensor for home VTR camera or industrial camera. Particularly, a solid-state image sensor with a photoconductive film, in which a photoconductive film is used as a light-sensitive section and signal processing is made by a Si scanning device, has a high sensitivity and no smearing and therefore it is said to be most suitable particularly to small-sized cameras.

The Si scanning device now used is mainly of the MOS type in which MOS switching elements are arranged in a matrix array and signals are read from a diode section formed of PN junctions by a shift register, and of the charge transfer type in which signals from a diode section formed of PN junctions are read in a charge transfer device (charge coupled device (CCD) or bucket brigade device (BBD)) by MOS FET and then transferred to an output state.

Particularly when a scanning device of charge transfer type is combined with a photoconductive film, the charge carrying capacity is usually smaller than the amount of signal charge produced in the photoconductive film, and thus much care must be taken to the processing of the signal charge. However, studies as to the above processing are actually insufficient so that the blooming phenomenon is not suppressed yet in this type of solid-state image sensor.

SUMMARY OF THE INVENTION

It is an object of this invention to provide a solid-state image sensor capable of satisfactorily suppressing the blooming phenomenon due to an inbalance in of the amounts charge as stated above.

In accordance with this invention, there is provided a solid-state image sensor formed of a combination of a semiconductor circuit substrate having a charge transfer function and a photoconductive film and in which the blooming suppression capability can be greatly enhanced by controlling the potential of a transparent electrode formed on the photoconductive film, the channel potential of a MOS field-effect transistor which comprises a Si diode which is electrically connected to the photoconductive film, a charge transfer stage and a gate electrode each formed in the semiconductor circuit substrate, and by further controlling the barrier potential of the charge transfer stage.

BRIEF DESCRIPTION OF THE DRAWINGS

FIG. 2 shows a drive pulse waveform and node potential change in the solid-state image sensor of FIG. 1.

FIG. 4 is a schematic potential diagram useful for explaining the blooming phenomenon.

FIGS. 5 and 6 are graphs showing the blooming suppression effect of this invention.

DESCRIPTION OF THE PREFERRED EMBODIMENTS

Figure 1:
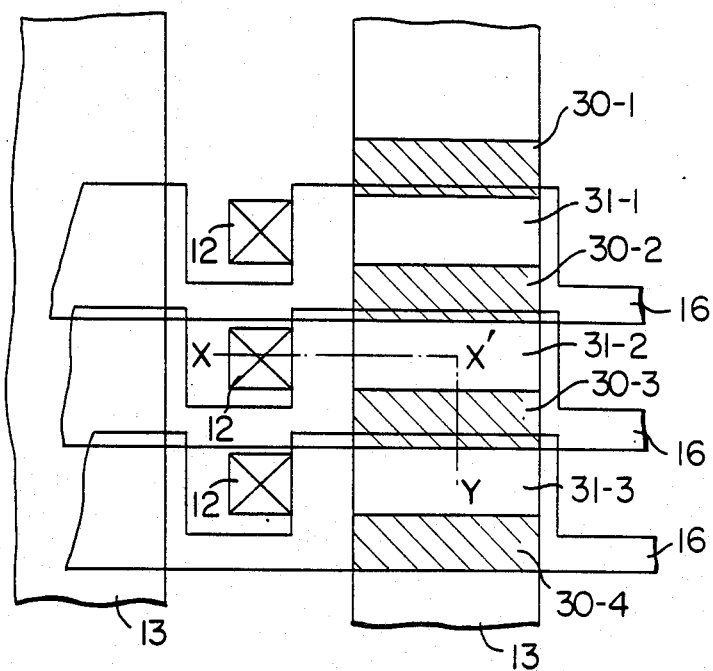
FIG. 1 is a plan view of a solid-state image sensor with a CCD is used as a photoconductive film in which a Si scanning device.

A solid-state image sensor according to this invention will hereinafter be described with reference to the drawings. FIG. 1 is a plan view of the structure of a solid-state image sensor with a photoconductive film which employs a buried channel CCD as a scanning device and reads signals from a diode section into a charge transfer state by a buried channel MOS FET. This image sensor is driven by a drive pulse shown in FIG. 2. One cell of this solid-state image sensor has a cross-sectional structure as shown in FIG. 3.

Figure 3:
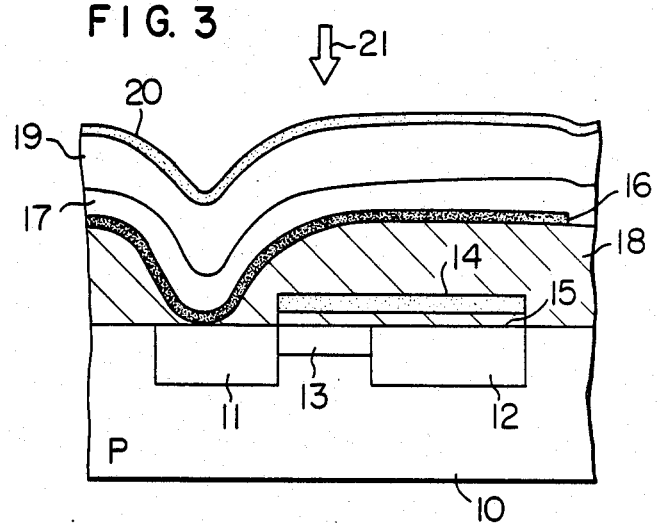
FIG. 3 is a cross-sectional view of one cell of the solid-state image sensor of FIG. 1.

In this solid-state image sensor, when a pulse is applied to a transparent electrode 20 in FIG. 3 at time $t_1$ during a vertical blanking period, the potential of a first electrode 16 is decreased through the capacitance coupling of a photoconductive film 19. Since the first electrode 16 is electrically connected to a diode 11, the potential of the diode becomes equal to that of the first electrode 16 (hereinafter, referred to as the node potential). Then, at time $t_2$, when a read pulse CH is applied, a signal charge stored in the diode 11 and photoconductive film 19 is moved to an n-well 12 for charge transfer, and the diode 11 and the photoconductive film 19 are charged to a certain initially-established potential (hereinafter, referred to as the reset potential). Thereafter, when the photo signal is stored for one frame period (33.3 ms), diode 11 and photoconductive film 19 are again reset. The charge moved to the transfer stage is transferred to an output stage at a frequency of 15.75 kHz. In the charge transfer stage potential barrier regions 30-1 to 30-4, and storage regions 31-1 to 31-4 are provided, and this makes it possible to carry out two-phase drive. In this way, signals in field A are read in. In field B, resetting is made after one field (16.67 ms) similarly as in the field A.

FIG. 3 is a cross-sectional view of one cell in the solid-stage image sensor. The diode 11 is made by forming an $n^+$ region in a P-type semiconductor substrate 10. The n-well 12 is for buried channel charge coupled diode (BCCD). After the n-well 12 is formed together with the channel 13 of MOS FET, boron is ion-implanted between the channel 13 and the n-wells for adjacent picture elements to form potential barriers. Numerals 14 and 15 represent the gate of the MOS FET and the gate oxide film, respectively. Numeral 16 designates an electrode of a hole blocking layer 17 made of ZnSe. This electrode 16 is insulated from the signal scanning circuit except with respect to a part of the diode 11, by an insulating layer 18 of phospho-silicate glass. The photoconductive film 19 is made of $(Zn_xCd_{1-x}Te)_{1-y}(In_2Te_3)_y$ on which the transparent electrode 20 is formed. An incident light 21 is irradiated from the transparent electrode 20 side to the image sensor.

The operation of the solid-state image sensor of such construction will be described with CH reference to FIG. 2. In FIG. 2, when the read pulse $V_{CH}$, transfer pulse $V_{Tr}$ and transparent electrode pulse are applied, a node potential $V_x$ at time 1 to 4 is:

(a) at time 1, $$V_x = V_s - \beta(V_{IH} - V_{IL}) \tag{1}$$

(b) at time 2, $$V_x = \gamma V_{CH} + V_{oPM} \quad (2)$$

(c) at time 3, $$V_x = \gamma V_{CH} + V^o{}_{PM} \quad (3)$$

(d) at time 4, $$V_x = \gamma V_{CH} + V^o{}_{PM} + \beta(V_{1H} V_{1L}) \quad (4)$$

where $V_s$: signal potential discharged by incident light
$\gamma$: rate of potential change of MOS FET channel portion by the application of gate voltage
$C_t$: sum of photoconductive film capacitance $C_N$ and diode capacitance $C_S$
$\beta$: $C_N/C_t$
$V^o{}_{PM}$: pinch-off voltage of MOS FET.

The node potential is changed as shown by FIGS. 2(c), (d) and (e) when incident light is dark, lower than saturation illuminance, and higher than saturation illuminance, respectively.

In the above operation, the quantity of signal charge $Q_s$ read in the vertical charge transfer stage is given by $$Q_S = C_t\{\gamma V_{CH} + V^o{}_{PM} - V_s + \beta(V_{1H} - V_{1L})\} \quad (5)$$

Since $V_s$ is expressed by $$V_s = \gamma V_{CH} + V^o{}_{PM} + \beta(V_{1H} - V_{1L}) - \eta n_p/C_t \quad (6)$$

Where $n_p$ is the number of incident photons and $\eta$ is the quantum efficiency, the quantity $Q_s$ is reduced to $$Q_s = \eta n_p \quad (7)$$

which means that the signal which is proportional to the intensity of incident light is outputted.

Ideally it is desirable that at any intensity of illumination the quantity of signal charge expressed by Eq. (7) is smaller than the maximum quantity of charge which can be handled (hereinafter referred to as charge carrying capacity) by the charge transfer stage. However, when a BCCD with high transfer efficiency is used or the device is reduced in size, the charge carrying capacity in the charge transfer stage is often smaller than the signal charge. In this case, excess charge over the charge carrying capacity in the charge transfer stage returns to the diode and is checked by the channel potential $V_{PM}$ at the time the MOS FET is in the off-state is equal to $V^o{}_{PM}$, and thus the node potential $V_x$ becomes smaller than $\gamma V_{CH} V^o{}_{PM}(V_x < \gamma V_{CH} + V_{PM})$.

FIG. 4 is a well-type potential diagram which shows the above described state. The potential diagram is made with reference to a cross-section taken along line X—X'-Y in FIG. 1. In FIGS. 4a–4d, the potential V increases positively in the direction of an arrow as shown. If the barrier potential in the charge transfer stage is higher than $V_{PM}$, as shown in FIG. 4c, charge $Q_{ex}$ is overflowed to storage regions of the charge transfer stage which are both adjacent to a charge transfer stage which corresponds to a picture element and has read in a signal, as shown in FIG. 4c. In other words, the charge carrying capacity is limited by the barrier potential $V_{pb}$ in the charge transfer stage, and the excess charge $Q_{ex}$ is transferred incompletely, therefore, when a spot light is irradiated this causes a trail of spot light, or blooming. The degree of spreading of a spot is $(1 + Q_{ex}/Q_{max})$ times as large as the spot when blooming occurs size where $Q_{max}$ is the charge carrying capacity in the transfer stage. Therefore, in order to suppress the blooming phenomenon, the condition of $$V_{pb} < V_{PM}$$

must be satisfied.

Another condition for suppression of blooming will be described below. As will be apparent from FIG. 2, in this embodiment the pulse $V_I$ to be applied to the transparent electrode 20 takes two values of $V_{IH}$ and $V_{IL}$.

As will be apparent from FIG. 2e, when light stronger than the saturation illuminance is incident on the device, the node potential is kept at $V_{IH}$ during storage period, and no bias is applied to the photoconductive film. The level of $V_{IH}$ at this time is adjusted so that the signal charge is not moved to the transfer stage by the transfer pulse. On the other hand, in the vertical blanking period, when the potential of the transparent electrode becomes $V_{IL}$, the photoconductive film is again reverse-biased to have a sensitivity to light. Assuming that the vertical blanking period is about 600 μs, strong light of about $(33.3/600 \times 10^{-3}) = 50$ times the saturation illuminance is incident to the device, and the node potential can be reduced to $V_{IL}$. At this time, if $V_{PM} V_{IL}$, the node potential is higher than the channel barrier even under the off-stage of the MOS FET as shown in FIG. 4d and thus the carriers produced in the photoconductive film are injected into the charge transfer stage and are overflowed therein to cause the blooming phenomenon. Therefore, the low-level voltage $V_{IL}$ to the transparent electrode during the vertical blanking period except the period for signal read in must be larger than $V_{PM}(V_{PM} < V_{IL})$. This is also true for the case where the transparent electrode pulse in the storage period takes the two values of $V_{IH}$ and $V_{IL}$ in synchronism with the transfer pulse. Accordingly, it is generally necessary for the transparent electrode to satisfy the condition of $V_{PM} < V_I$.

Figure 5:
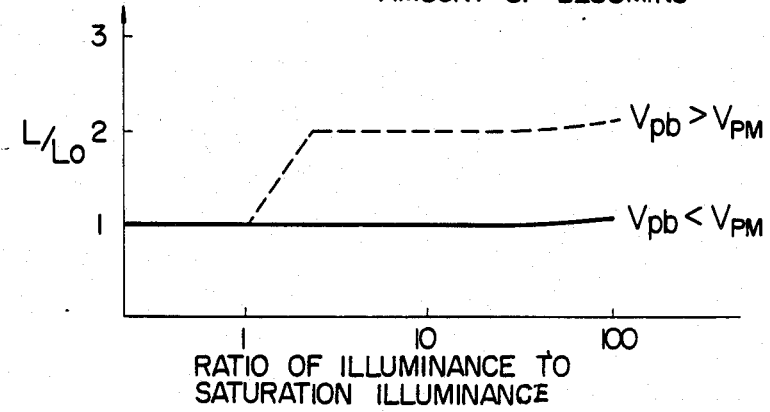

The solid-state image sensor according to this invention, with such structure which is made to satisfy the above conditions, has a remarkable effect as shown in FIGS. 5 and 6. FIG. 5 shows the plot of the amount of blooming when it is so made that $V_{pb} < V_{PM}$, and shows the degree of spreading of spot due to blooming, relative to the vertical length $L_o$ of the spot. FIG. 6 shows the amount of blooming when it is so made that $V_{PM} < V_I$. The ordinate in FIG. 6 indicates the same degree of spreading as that in FIG. 5. The abscissa in FIGS. 5 and 6 indicates ratio of illuminance to saturation illuminance or illuminance based on the saturation illuminance which is assumed to be unity. It will be understood from FIGS. 5 and 6 that the blooming phenomenon due to overflowing of signal charge in the charge transfer stage is remarkably decreased. The slight increase of blooming for the case when the ratio of illuminance to the saturation illuminance is large is due to diffused reflection of light at protective glass. This amount of blooming is only half or less than half of the amount of blooming in the normal image pick-up tube.

While in this embodiment the pseudo two-phase BCCD made by ion-implanting boron is used for charge transfer stage and the same electrode is used to read in signals and to transfer charge signals, this invention is not limited to the above arrangement but may be applied to three-phase and four-phase driving types and to the type in which the reading-in of signals and charge transfer are made by separate electrodes. In addition, a BBD may be used as the charge transfer device. While the MOS FET for reading-in of signals is of depletion type, it may be of enhancement type, by which the same action and effect can be achieved.

We claim:

1. A solid state image sensing method for use in a solid state sensor having a semiconductor substrate of one conductivity type, a plurality of diode regions disposed in said semiconductor substrate, said diode regions being of a different conductivity type than that of said substrate, at least one charge transfer means disposed in said semiconductor substrate and including (i) doped potential barrier regions of a conductivity type which is different from that of said substrate and (ii) charge storage regions, a plurality of channel regions respectively disposed adjacent to said diode regions and said charge transfer means in said semiconductor substrate, a plurality of gate electrodes respectively disposed on said respective channel regions, an insulating layer disposed on said semiconductor substrate and said gate electrodes except at portions of said diode regions, a plurality of first electrodes disposed on said insulating layer and on said portions of said respective diode regions, at least one photoconductive film disposed on said first electrodes and said insulating layer, and at least one transparent electrode disposed on said photoconductive film, said method comprising the steps of:

applying a pulse voltage $V_{IH}$ to said transparent electrode provided for a respective one of said diode regions during a signal charge storage period;

applying a pulse voltage $V_{IL}$ to said transparent electrode provided for said respective one of said diode regions during a vertical blanking period, said pulse voltage $V_{IH}$ being higher than said pulse voltage $V_{IL}$; and controlling a potential $V_{PM}$ of one of said channel regions associated with said respective one of said diode regions such that said potential $V_{PM}$ is less than said pulse voltage $V_{IL}$.

2. A solid state image sensing method according to claim 1, further comprising the step of controlling barrier potentials $V_{pb}$ for separating signal charges of the charge transfer regions to satisfy a condition given by $$V_{pb} < V_{PM}.$$

3. A solid state image sensor comprising;
a semiconductor substrate of one conductivity type,
a plurality of diode regions disposed in said semiconductor substrate, said diode regions being of a different conductivity type from that of said substrate,
charge transfer means disposed in said substrate having a plurality of charge storage regions and a plurality of doped potential barrier regions of a conductivity type different from that of said substrate, said charge storage regions and said potential barrier regions being disposed alternately,
a plurality of channel regions respectively disposed adjacent to said diode regions and said charge transfer means in said semiconductor substrate,
a plurality of gate electrodes respectively disposed on said channel regions,
a plurality of charge transfer electrodes respectively disposed on said potential barrier regions and said charge storage regions,
an insulating layer disposed on said semiconductor substrate, said gate electrodes, and said charge transfer electrodes except at portions of said diode regions,
a plurality of first electrodes disposed on said insulating layer and on respective portions of said respective diode regions,
at least one photoconductive film disposed on said first electrodes and said insulating layer, and
at least one transparent electrode disposed on said photoconductive film,
means for applying voltages to said sensor such that a potential $V_{pb}$ of one of said potential barrier regions, during operation of said sensor, is kept less than a potential $V_{PM}$ of an associated one of said channel regions even if a pulse voltage is applied on said gate electrodes or said charge transfer electrodes.

4. A solid state image sensor according to claim 3, wherein said gate electrodes and said charge transfer electrodes are common electrodes.

5. A solid state image sensing method for use in a solid state sensor having a semiconductor substrate of one conductivity type, a plurality of diode regions disposed in said semiconductor substrate and having a conductivity type different from that of said substrate, at least one charge transfer means disposed in said semiconductor substrate, said charge transfer means including a plurality of charge transfer regions and a plurality of doped potential barrier regions of a conductivity type different from that of said substrate, a plurality of charge transfer electrodes disposed on said potential barrier regions, a plurality of channel regions respectively disposed adjacent to said diode regions and said charge transfer means in said semiconductor substrate, a plurality of gate electrodes respectively disposed on at least said channel regions, an insulating layer disposed on said semiconductor substrate and said gate electrodes except at portions of said diode regions, a plurality of first electrodes disposed on said insulating layer and on respective said portions of said diode regions, at least one photoconductive film disposed on said first electrodes and said insulating layer, and at least one transparent electrode disposed on said photoconductive film, said method comprising the steps of:

applying a pulse voltage $V_{IH}$ to said transparent electrode provided for a respective one of said diode regions during a signal charge storage period;

applying a pulse voltage $V_{IL}$ to said transparent electrode provided for said respective one of said diode regions during a vertical blanking period, said pulse voltage $V_{IH}$ being higher than said pulse voltage $V_{IL}$; and controlling a potential $V_{PM}$ of a channel region associated with said respective one of said diode regions such that said potential $V_{PM}$ is less than said pulse voltage $V_{IL}$ when said gate electrodes are in an OFF state, the potential $V_{pb}$ of said potential barrier region being kept less than the potential $V_{PM}$ of said channel region, even if a pulse voltage is applied on said gate electrodes or said charge transfer electrodes.

* * * * *